(12) United States Patent
Akaiwa (10) Patent No.: US 8,175,551 B2
(45) Date of Patent: May 8, 2012

(54) DISTORTION COMPENSATION DEVICE FOR USE IN HIGH-FREQUENCY POWER AMPLIFIER

(75) Inventor: Yoshihiko Akaiwa, Fukuoka (JP)

(73) Assignee: NEC Corporation, Tokyo (JP)

( * ) Notice: Subject to any disclaimer, the term of this patent is extended or adjusted under 35 U.S.C. 154(b) by 368 days.

(21) Appl. No.: 11/993,389

(22) PCT Filed: Jun. 26, 2006

(86) PCT No.: PCT/JP2006/313165
§ 371 (c)(1),
(2), (4) Date: Apr. 2, 2010

(87) PCT Pub. No.: WO2006/137600
PCT Pub. Date: Dec. 28, 2006

(65) Prior Publication Data
US 2010/0201442 A1  Aug. 12, 2010

(30) Foreign Application Priority Data
Jun. 24, 2005  (JP) .................................. 2005-184397

(51) Int. Cl.
*H04B 1/04* (2006.01)
(52) U.S. Cl. ........................ 455/114.3; 330/52; 330/149
(58) Field of Classification Search ................. 455/114.3
See application file for complete search history.

(56) References Cited

U.S. PATENT DOCUMENTS

| 6,836,517 | B2 | 12/2004 | Nagatani et al. | |
|---|---|---|---|---|
| 2003/0234688 | A1 | 12/2003 | Matsuyoshi et al. | |
| 2004/0232986 | A1* | 11/2004 | Hirose et al. | 330/149 |
| 2005/0017801 | A1* | 1/2005 | Bachman et al. | 330/149 |
| 2005/0189990 | A1* | 9/2005 | Mizuta et al. | 330/52 |

FOREIGN PATENT DOCUMENTS

| DE | 100 09 596 A1 | 8/2001 |
|---|---|---|
| EP | 1 569 331 A1 | 8/2005 |
| GB | 2 356 992 A | 6/2001 |
| JP | 57-072406 A | 5/1982 |
| JP | 2001-189685 A | 7/2001 |
| JP | 2001-203539 | 7/2001 |
| JP | 2002-506305 A | 2/2002 |
| JP | 2002-290159 A | 10/2002 |
| JP | 2003-309436 | 10/2003 |
| JP | 2004-112151 | 4/2004 |
| JP | 2006-60521 | 3/2006 |

\* cited by examiner

*Primary Examiner* — Duc Nguyen
*Assistant Examiner* — Ajibola Akinyemi
(74) *Attorney, Agent, or Firm* — Dickstein Shapiro LLP (57) ABSTRACT

A non-linear distortion signal contained in output signal components from a high-frequency power amplifier is detected, while a non-linear distortion signal is generated from a high-frequency signal to be amplified. Correlation between this non-linear distortion signal and the detected non-linear distortion signal is determined, and a control variable is calculated based on the signal thus obtained. The obtained control variable is multiplied by the generated non-linear distortion signal to generate a distortion compensation signal, which is added to the signal to be amplified. This provides a distortion compensation device capable of automatically maintaining optimum distortion compensation characteristics and rapidly achieving desirable distortion compensation.

8 Claims, 6 Drawing Sheets

DISTORTION COMPENSATION DEVICE FOR USE IN HIGH-FREQUENCY POWER AMPLIFIER

TECHNICAL FIELD

The present invention relates to a device for compensating non-linear distortion occurring during power amplification of high-frequency signals.

BACKGROUND ART

On amplifying high-frequency signals, linearity is required between input and output signals when an envelope of the input signal is varied with time. This is because absence of linearity will cause occurrence of so-called non-linear distortion (hereafter, referred to as "distortion"). Such non-linear distortion brings about radiating unnecessary power outside a desired band for original signals and results in interference with an adjacent channel.

Actual power amplifiers however have not a little non-linearity, and it is impossible to obtain perfect linearity in them. In general, power efficiency of the power amplifier, namely, a rate of power of high-frequency signals to the power of the power source tends to be reduced when placing importance on the linearity. In contrast, the non-linearity will be increased if it is tried to increase the power efficiency. Proposal has been made about techniques of compensating the non-linear distortion caused to occur in the amplifiers, so as to alleviate a trade-off between these conflicting characteristics of the amplifiers.

DISCLOSURE OF THE INVENTION

Problems to be Solved by the Invention

The related techniques to compensate the non-linear distortion are largely classified into a negative feedback technique, a feed-forward technique, and a predistorter technique. The negative feedback technique has an advantage that a high speed operation can be accomplished, but has a disadvantage that such an operation becomes instable as the distortion compensation is increased. The feed-forward technique can realize a stable operation, but has a shortcoming that the overall power efficiency is low due to the necessity of a secondary amplifier.

The predistorter technique is advantageous in these respects and therefore, has come under attention. However, this technique still has a problem that the characteristics of the power amplifier are varied by a fluctuation in the central frequency of the signals, voltage variation, temperature change, or aging. Therefore, it is important to determine how optimum distortion compensation characteristics can be automatically maintained. It is also a problem to be solved in association with the conventional predistorter technique that a longer period of time is required to achieve optimum distortion compensation characteristics compared to the negative feedback technique.

The present invention has been made in view of the problems as mentioned in the above, and seeks to solve the problem and to provide a predistorter-type distortion compensation device which is capable of automatically maintaining optimum distortion compensation characteristics, and rapidly achieving distortion compensation.

Means for Solving the Problems

In order to solve the problems above, one embodiment of the present invention is characterized by including:

distortion detection means for detecting a distortion detection signal in an amplifier output signal from the power amplifier;

distortion signal generation means for receiving a signal to be amplified, to generate an n-th (n is an integer of two or more) non-linear distortion signal;

distortion compensation signal generation means for generating a distortion compensation signal by multiplying the non-linear distortion signal by a control variable;

a correlation circuit for determining correlation between the n-th non-linear distortion signal and the distortion compensation signal; and phase compensation means, arranged upstream of the distortion detection means, for compensating phase rotation of the signal, the control variable being determined by an output signal of the correlation circuit.

According to another aspect of the present invention, there is obtained a method of compensating non-linear distortion generated in a power amplifier, comprising the steps of:

detecting a distortion detection signal in an amplifier output signal from the power amplifier;

generating an n-th (n is an integer of two or more) non-linear distortion signal; and generating a distortion compensation signal by using the distortion detection signal and the n-th non-linear distortion signal.

Advantageous Effects of the Invention

According to the present invention, even if the amplifier characteristics are varied, optimum distortion compensation characteristics can be automatically achieved, and it is possible to shorten the period of time required for obtaining the optimum distortion compensation characteristics.

BEST MODE FOR CARRYING OUT THE INVENTION

Embodiment of the present invention will be described with reference to the accompanying drawings.

Figure 1:
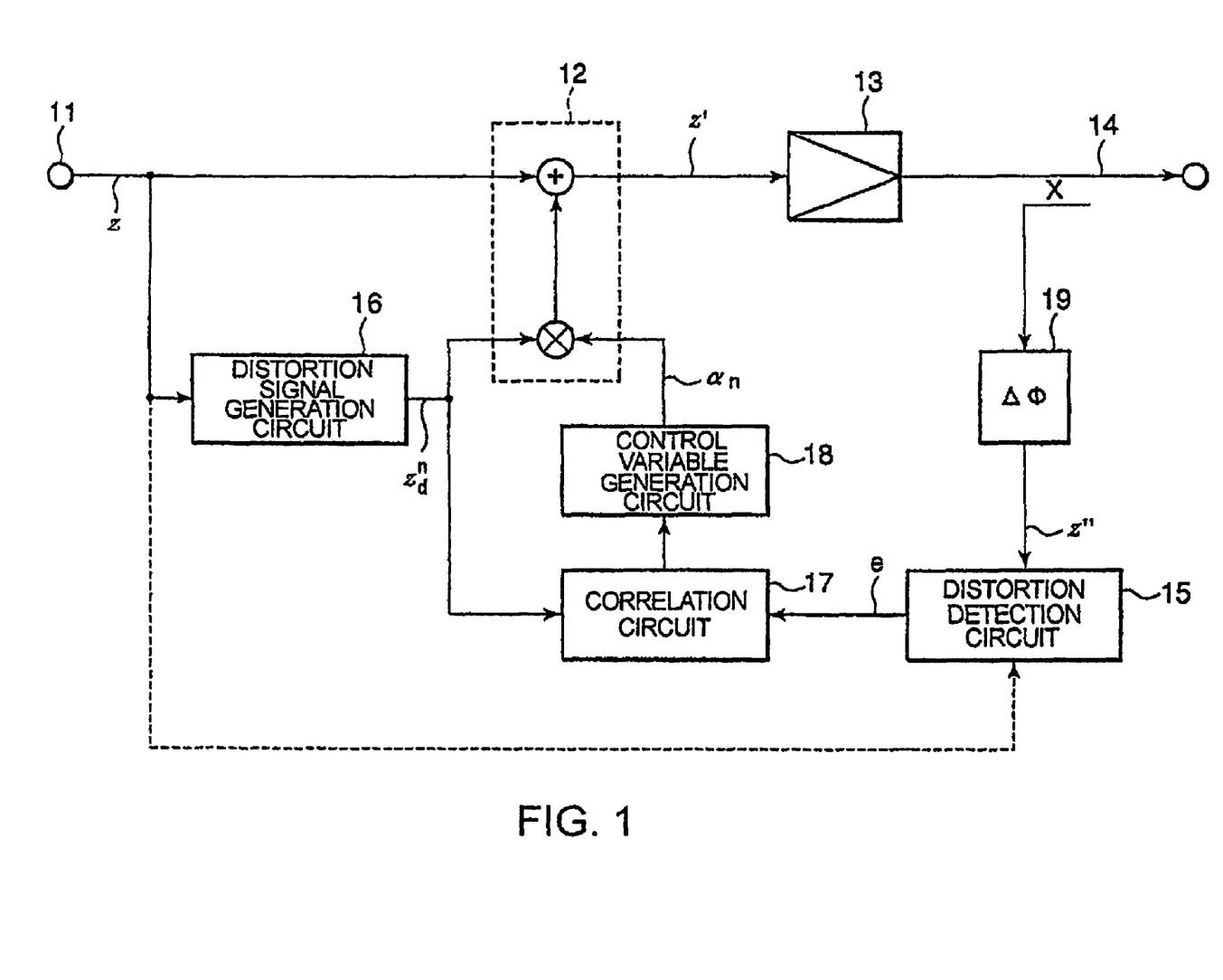
FIG. 1 is a circuit block diagram of a distortion compensation device according to a first embodiment of the present invention.

FIG. 1 is a circuit block diagram for explaining a distortion compensation device according to a first embodiment of the present invention. Overall operation of the device will be described using FIG. 1. A high-frequency signal to be amplified is input through an input terminal 11 to a distortion compensation signal generation circuit 12 and a distortion signal generation circuit 16. The distortion compensation signal generation circuit 12 supplies a power amplifier 13 with a signal to be amplified, as an amplifier input signal, and generates a distortion compensation signal for canceling the distortion component generated by a power amplifier 13 within the distortion compensation signal generation circuit 12 in a manner to be described later.

An output signal of the power amplifier 13 is supplied to an output terminal 14 and is partly given to a distortion detection circuit 15 through a phase compensation circuit 19, so as to extract a distortion signal component (may be called a distortion detection signal). Alternatively, the high-frequency signal to be amplified input through the input terminal 11 may be directly given to the distortion detection circuit 15, as indicated by the broken line in FIG. 1.

The distortion signal generation circuit 16 receives the high-frequency input signal and generates a high-order (n-th) distortion signal. "n" may take a value of 3, 5, 7, or the like. The n-th distortion signal of the distortion signal generation circuit 16 is partly input to the distortion compensation signal generation circuit 12 and multiplied by an n-th control variable generated by a control variable generation circuit 18 so as to produce the distortion compensation signal. Another part of the n-th distortion signal is input to a correlation circuit 17 where correlation calculation is conducted between the n-th distortion signal and an output signal from the distortion detection circuit 15. An output signal from the correlation circuit 17 is input to the control variable generation circuit 18, so as to produce a control variable.

The phase compensation circuit 19 compensates phase rotation that might occur in a signal from the input terminal 11 to an output terminal of the distortion detection circuit 15. Operation of the phase compensation circuit 19 will be described later in detail.

Figure 2:
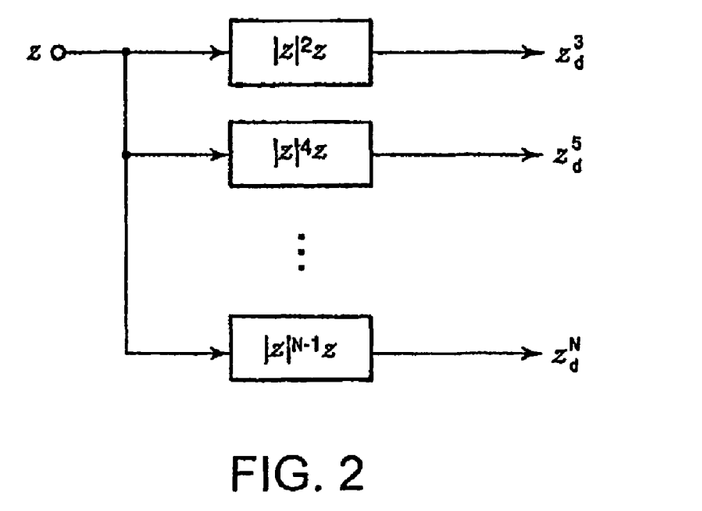
FIG. 2 is a block diagram showing an example of a distortion signal generation circuit.

FIG. 2 is a circuit diagram showing an example of a distortion signal generation circuit according to an embodiment of the present invention. Description will be made using mathematical expressions. An arbitrary high-frequency signal can be represented by the following equation.

$$s(t) = A(t)\cos(\omega_c t + \phi(t)) \quad (1)$$

where A(t) denotes an amplitude, $\omega_c$ denotes a carrier wave frequency, and $\phi(t)$ denotes a phase. Information in the signal is reflected in A(t) and $\phi(t)$. The equation above can be rewritten as follows using a trigonometric function formula.

$$s(t) = A(t)\cos\varphi(t)\cos\omega_c t - A(t)\sin\varphi(t)\cos\omega_c t \quad (2)$$
$$= x(t)\cos\omega_c t - y(t)\sin\omega_c t$$

where $x(t) = A(t)\cos\varphi(t)$, and $y(t) = A(t)\sin\varphi(t)$.

The equation (1) can be represented as follows, using complex numbers.

$$s(t) = \text{Re}[A(t)e^{j\varphi(t)}e^{j\omega_c t}] \quad (3)$$
$$= \text{Re}[z(t)e^{j\omega_c t}]$$

where:

$$z(t) = x(t) + jy(t) \quad (4)$$

When a component of the n-th distortion signal of s(t) around the carrier wave frequency $\omega_c$ is represented as $s_d^n(t)$, it can be represented as follows.

$$s_d^n(t) = A^n(t)\cos(\omega_c t + \varphi(t)) \quad (5)$$
$$= \text{Re}[A^n(t)e^{j\varphi(t)}e^{j\omega_c t}]$$

The value of the carrier wave frequency $\omega_c$ is irrespective of the present invention and, is therefore neglected, and the ($\omega_c$=0) signal is represented using complex numbers. A complex signal z(t) contains all information in the signal. If an actual high-frequency signal is to be represented, the equation (3) may be used.

A complex representation $z_d^n(t)=|z(t)|^{n-1}z(t)$ is obtained for the distortion signal $s_d^n(t)$ obtained by the equation (5). In this complex representation, it is given that $A^n=|z(t)|^n$ (the symbol |•| denotes an absolute value).

The signals represented as z and $z_d^n$ in FIG. 2 are complex representations from which the time factor t is omitted for simplification of description. It should be noted that the output from the distortion signal generation circuit 16 in FIG. 1 consists of a plurality of these distortion signals. The control variable generation circuit 18 also generates the same number of control variable $\alpha_n$ as the number of the distortion signals. An example of operation of the distortion compensation signal generation circuit 12 can be represented as follows by using mathematical expression. The output signal z' of this circuit 12 is represented as:

$$z' = z + \alpha_3 z_d^3 + \alpha_5 z_d^5 + \ldots + \alpha_N z_d^N \quad (6)$$
$$= z + \alpha_3 |z|^2 z + \alpha_5 |z|^4 z + \ldots + \alpha_N |z|^{N-1} z$$

The output signal z' is obtained by adding the signal z to be amplified and the n-th distortion compensation signal, as shown in FIG. 1. The principle thereof is that distortion in the amplifier output is canceled by inputting, as an internal signal, a signal having the same amplitude as the distortion component and opposite phase to that of the distortion component generated in the amplifier and by adding the internal signal to the signal to be amplified. The n-th distortion compensation signal is obtained by multiplication of the n-th distortion signal $z_d^n$ and each control variable $\alpha_n$.

Figure 3:
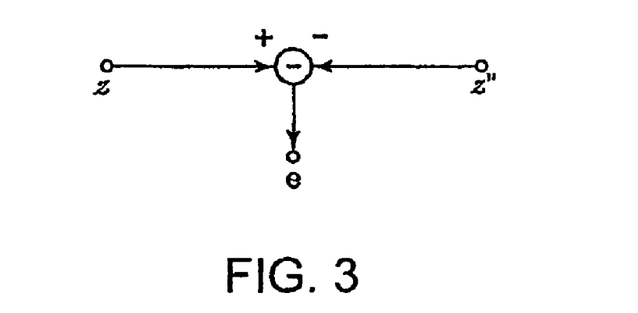
FIG. 3 is a block diagram showing a first example of a distortion detection circuit.

A first example of the distortion detection circuit is shown in FIG. 3. This circuit finds a difference between the signal z to be amplified and a signal z'' obtained from an output signal of the amplifier 13.

Figure 4:
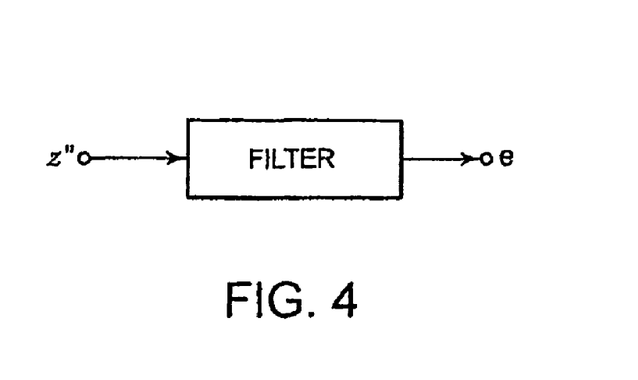
FIG. 4 is a block diagram showing a second example of a distortion detection circuit.
Figure 5:
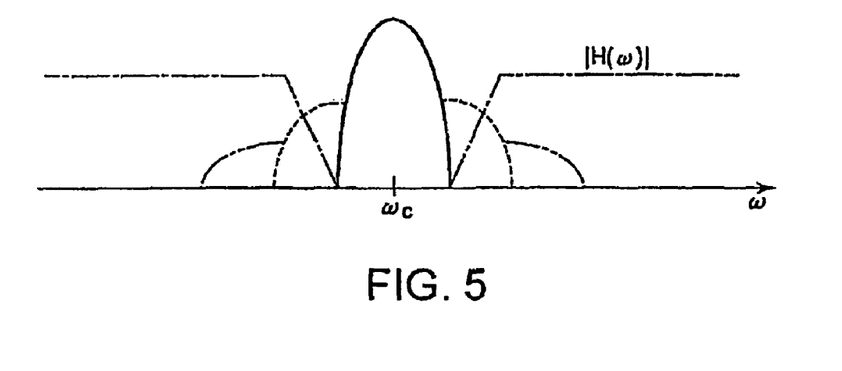
FIG. 5 is an explanatory diagram illustrating relation between filter characteristics of the distortion detection circuit shown in FIG. 4 and power spectrum of signals including distortion signals.

A second example of the distortion detection circuit is shown in FIG. 4. This circuit extracts a distortion signal component by allowing the signal obtained from an output signal of the amplifier to pass through a filter. FIG. 5 is a conceptual diagram of a spectrum for explaining operation of this circuit. The solid line in FIG. 5 represents the spectrum of the signal to be amplified, and the broken line represents a spectrum of a signal generated due to distortion. The amplitude characteristics |H(ω)| of the filter shown in FIG. 4 is ideally such that only the distortion signal component shown in FIG. 5 is allowed to pass through.

Figure 6:
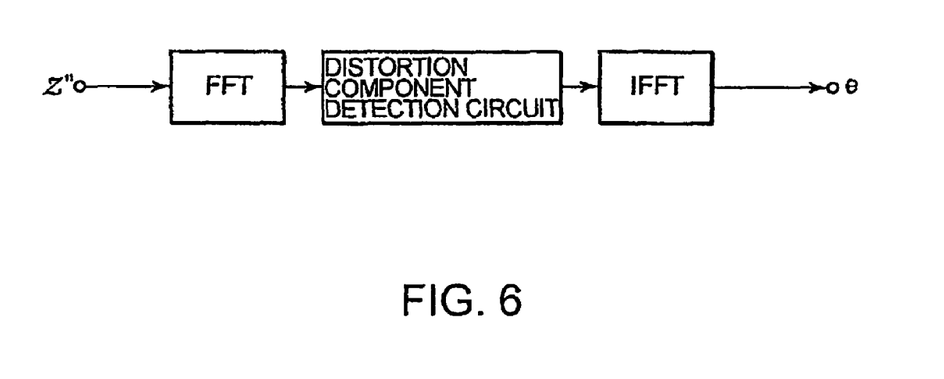
FIG. 6 is a block diagram showing a third example of a distortion detection circuit.

FIG. 6 shows a third example of the distortion detection circuit. In this circuit, a fast Fourier transform (FFT) is performed prior to extracting only the frequency component due to distortion by a distortion component detection circuit. After that, an inverse fast Fourier transform (IFFT) may be performed to return the signal to a signal of time region. Alternatively, a correlation may be obtained while keeping the signal in frequency region.

Figure 7:
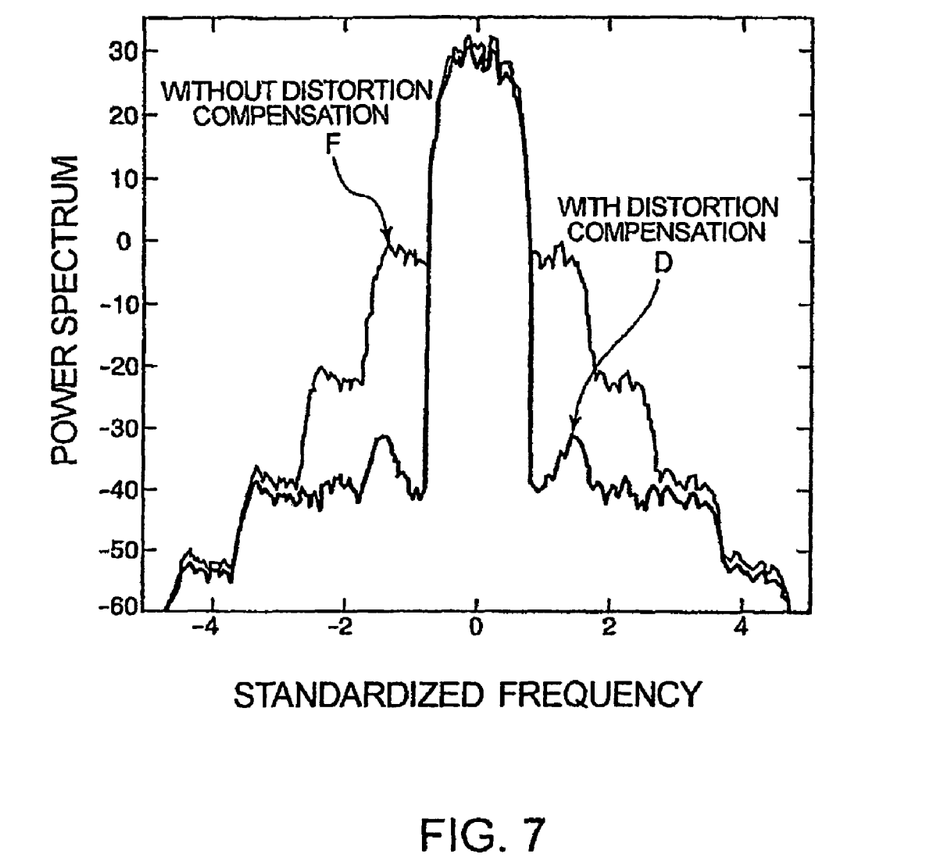
FIG. 7 is an explanatory diagram showing an example of distortion compensation characteristics.

As shown in FIG. 1, the correlation circuit 17 according to the present invention calculates a correlation value between an n-th distortion signal $z_d^n$ generated by the distortion signal generation circuit 16 and a distortion signal e output from the distortion detection circuit 15, and the correlation value is denoted by $z_d^{n*}$ (the symbol * indicates a complex conjugate). The control variable generation circuit 18 generates a control variable $\alpha_n$ based on the correlation value. Any method can be used for this purpose as long as the distortion signal e is approximated to zero. For example, when the distortion compensation device is embodied as a discrete time system, a method of least mean squares (LMS) as follows can be used.

$$\alpha_n[m+1] = \alpha_n[m] + \mu z_d^{n*}[m]e[m] \quad (7)$$

where m represents a discrete time (m=0, 1, 2, ...), and $\mu$ is a small constant. The control variable $\alpha_n$ starts from an arbitrary initial value (usually zero) and automatically converges over time to such a value that an average value of $|e[m]|^2$ becomes a minimum value. This can be expressed mathematically that the distortion signal is relatively small. However, description of this will be omitted here since the description will not be concise and will become lengthy. Instead, the validity of the operation is proven by a computer simulation experiment. FIG. 7 shows the distortion compensation characteristics obtained by the control variable generation algorithm described above, in the form of power spectrum. It can be seen that the out-of-band power component is decreased by the reduction of distortion.

Figure 8:
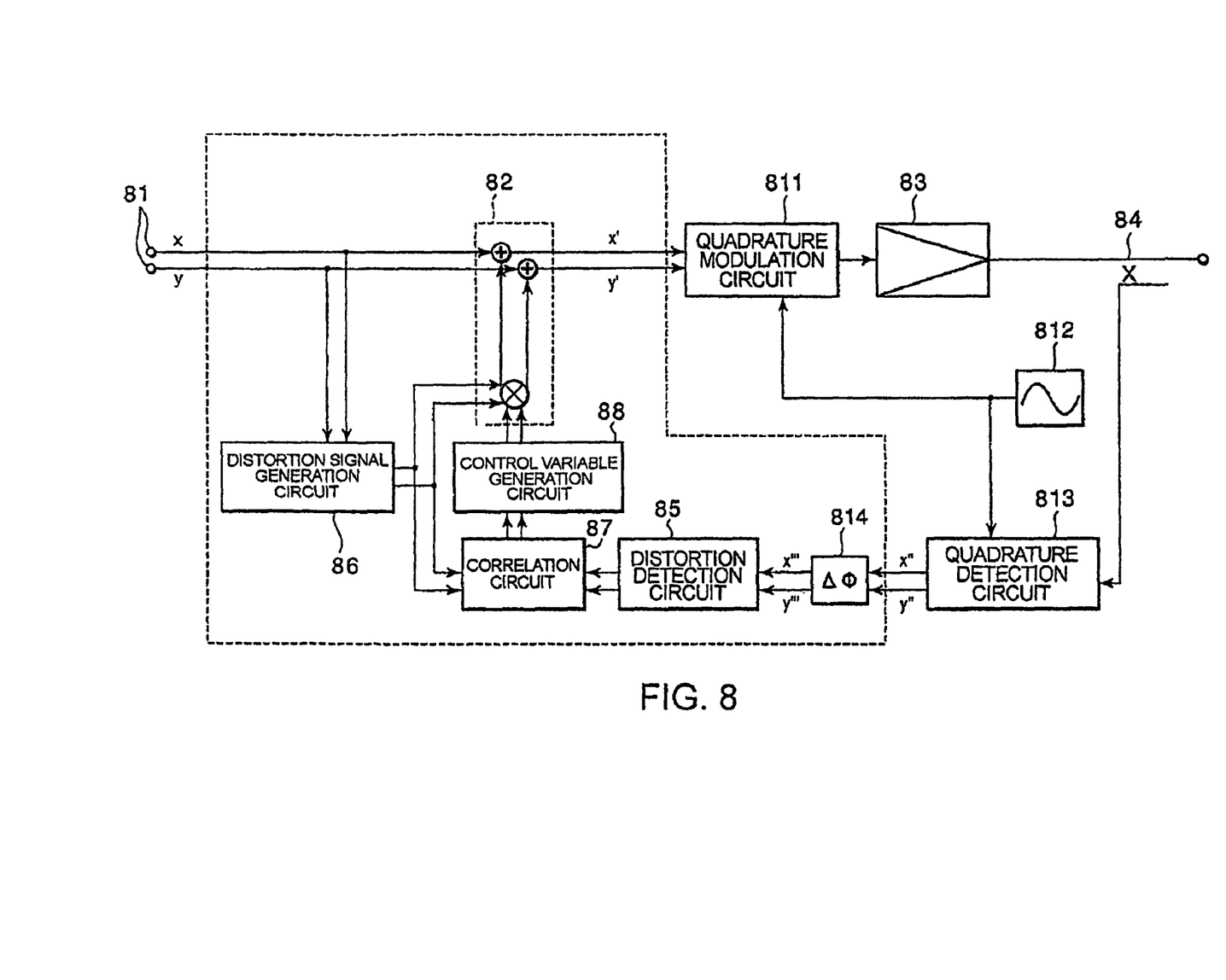
FIG. 8 is a circuit block diagram showing a distortion compensation device according to a second embodiment of the present invention.

FIG. 8 shows a second embodiment of the distortion compensation device according to the present invention. This second embodiment differs from the first one shown in FIG. 1 in that a quadrature modulation circuit 811, a local oscillation circuit 812, and a quadrature detection circuit 813 are additionally provided, and a phase compensation circuit 814 is altered. The remaining circuit configuration is the same as the first embodiment, and the numerical references 1 to 8 are changed to numerical reference 81 to 88, respectively. The quadrature modulation circuit 812 performs calculation expressed by the equation (2) when a signal to be transmitted is represented by an in-phase component x(t) and a quadrature component y(t). The local oscillation circuit 812 is a circuit generating sinusoidal waves (cos $\omega_c t$ and sin $\omega_c t$) of the carrier wave frequency $\omega_c$. Further, the quadrature detection circuit 812 functions to extract in-phase and quadrature components x(t) and y(t) from the high-frequency signal s(t) obtained by the equation (2). Since particulars of operation of the local oscillation circuit are well known to those skilled in the art, the description thereof will be omitted here. The phase compensation circuit 814 is a circuit to rotate the phase of the input signal based on the phase and quadrature component signals. Operation of the phase compensation circuit 814 can be represented by mathematical expressions as follows.

$$x'''(t) = x''(t)\cos\Delta\phi - y''(t)\sin\Delta\phi \quad (8a)$$

$$y'''(t) = x''(t)\sin\Delta\phi + y''(t)\cos\Delta\phi \quad (8b)$$

where $\Delta\phi$ denotes an amount of phase rotation. The value of $\Delta\phi$ is set so as to cancel the phase rotation that is caused when a signal z=x+jy input to the input terminal 81 passes through the quadrature modulation circuit 811, the amplification circuit 83, and the quadrature detection circuit 813. More specifically, this can be done by detecting the phase difference between the signals z=x+jy and z''=x''+jy''. When a digital signal processing is to be carried out, an iteration method as follows can be used.

$$\Delta\phi[m+1] = \Delta\phi[m] + \mu\text{Im}\{z[m]z'''^*[m]\} \quad (9)$$

$$= \Delta\phi[m] + \mu(-x[m]y'''[m] + y[m]x'''[m])$$

where $\mu$ is a small constant, x[m] and y[m] respectively denote an in-phase and quadrature component of a discrete time signal of the input signal z, and x'''[m] and y'''[m] are outputs from the phase compensation circuit 814.

Operation of the second embodiment of the present invention is the same as the operation of the first embodiment when the in-phase and quadrature components in the complex representation z(t)=x(t)+jy(t) of the signal are replaced by x(t) and y(t) in the first embodiment. Therefore, further description will be omitted here. In the embodiment of the present invention, the portion enclosed by the broken line is preferably embodied by so-called digital signal processing. In this case, although not shown in FIG. 8, a digital-analogue modulation circuit is used for the part of the outputs x' and y' from the broken line portion, and an analogue-digital conversion circuit is used for the part of the inputs x'' and y'' to the broken line portion. This embodiment has advantages that the signal processing can be performed in the base band, and the use of the digital signal processing is facilitated.

Figure 9:
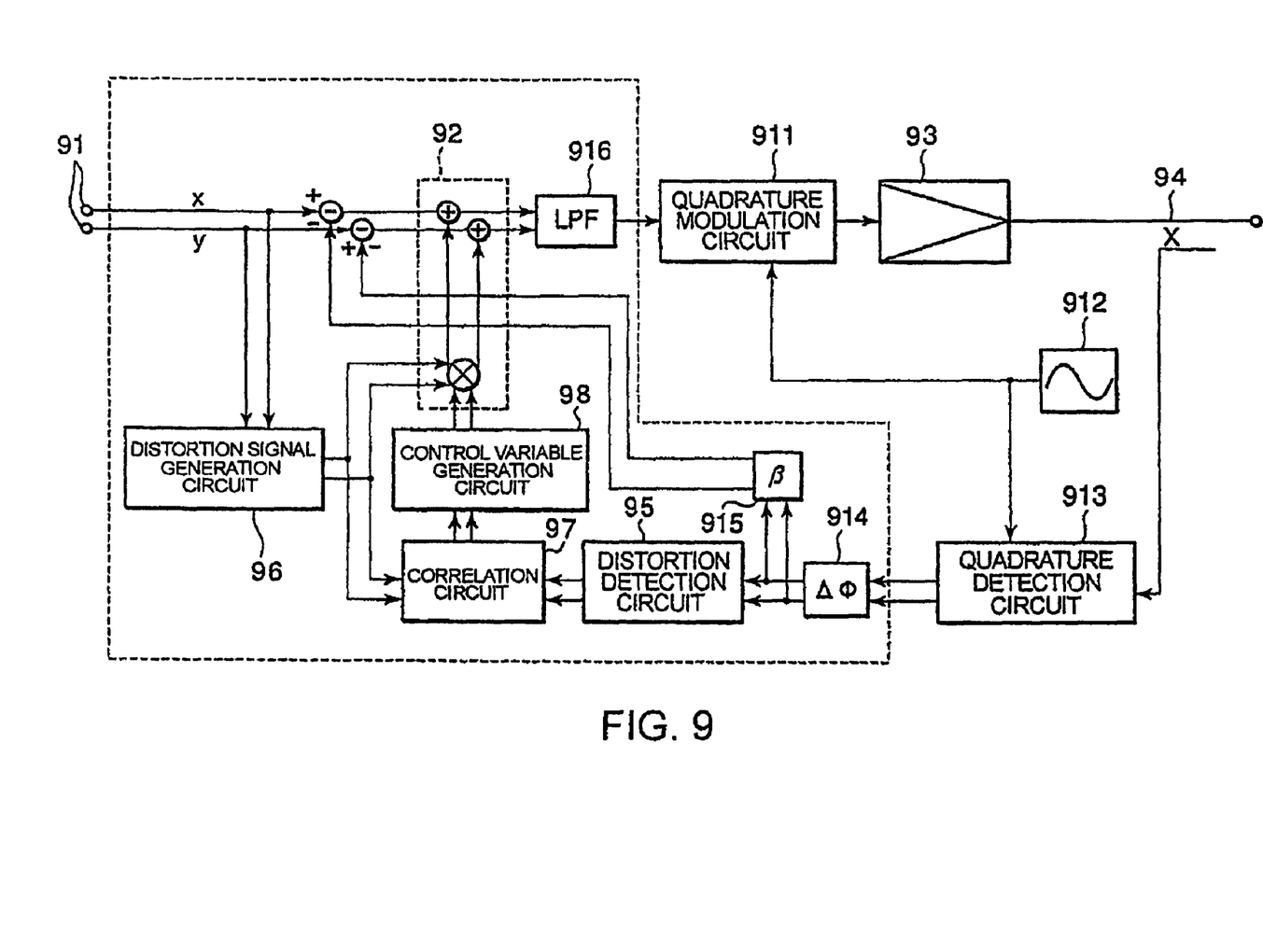
FIG. 9 is a circuit block diagram of a distortion compensation device according to a third embodiment of the present invention.

A third embodiment of the distortion compensation device according to the present invention is shown in FIG. 9. This embodiment is the same as the second one except that the numerical references 81 to 88 and 811 to 814 are changed to numerical references 91 to 98 and 911 to 914, and a negative feedback circuit is added. The negative feedback circuit is formed by multiplying a part of the output of the phase compensation circuit 914 by a constant ($\beta$) of a coefficient multiplication circuit 915, and then subtracting the product from a signal z=x+jy input through the input terminal 91. The subtracted signal is input to the distortion compensation signal generation circuit 92 instead of the high-frequency signal input through the input terminal 91. The constant $\beta$ is determined in view of a degree of distortion compensation and stability of the circuit operation. A low-pass filter (LPF) 916 is inserted between the distortion compensation signal generation circuit 92 and the quadrature modulation circuit 911 to ensure stability of the negative feedback circuit. The remaining circuit configuration of this embodiment is the same as that of the second embodiment, and therefore further description will be omitted. In this embodiment, it is essential to input a negative feedback signal to the input of the distortion compensation signal generation circuit 92. This embodiment has an advantageous effect that the problem intrinsic to the predistorter-type distortion compensation method that it takes a long time to converge to optimum distortion compensation characteristics can be improved by way of the negative feedback method. In another respect, it can be said that the disadvantage of the negative feedback method that operation becomes instable when trying to conduct large distortion compensation is solved by causing the predistorter-type distortion compensation to share the amount of distortion compensation.

The invention claimed is:

1. A distortion compensation device connected to a power amplifier amplifying a high-frequency signal to compensate non-linear distortion generated in the power amplifier, the distortion compensation device having an input terminal supplied with the high-frequency signal and an output terminal supplied with a power amplifier output and comprising:
    a distortion detection circuit which is coupled to the output terminal and which detects a distortion signal in the power amplifier output;
    a distortion signal generation circuit receiving the high-frequency signal through the input terminal and generating an n-th (n is an integer of two or more) non-linear distortion signal;
    a distortion compensation signal generation circuit generating a distortion compensation signal by multiplying the non-linear distortion signal by a control variable, to supply the distortion compensation signal to the power amplifier;
    a correlation circuit which is coupled to the distortion signal generation circuit and the distortion detection circuit and which determines correlation between the n-th non-linear distortion signal and the distortion signal to produce a correlation value varied so that the distortion signal is approximated to zero; and
    a control variable generation circuit which is coupled to the correlation circuit and the distortion compensation signal generation circuit to supply the control variable to the distortion compensation signal generation circuit in response to the correlation value.

2. The distortion compensation device according to claim 1, wherein the distortion detection circuit detects an error between a signal obtained from the power amplifier output and the signal to be amplified.

3. The distortion compensation device according to claim 1, wherein the distortion detection circuit detects a frequency component generated due to distortion by causing a signal obtained from the power amplifier output to pass through a filter.

4. The distortion compensation device according to claim 1, wherein the distortion detection circuit detects a frequency component generated due to distortion after Fourier transforming a signal obtained from the power amplifier output.

5. The distortion compensation device according to claim 1, further comprising:
    a quadrature modulation circuit arranged upstream of the power amplifier; and
    a quadrature detection circuit receiving a signal obtained from an output of the power amplifier,
    wherein a base band signal of in-phase and quadrature components is used as the signal to be amplified to perform phase compensation, distortion detection, correlation calculation, generation of a distortion signal, generation of a control signal, and generation of a distortion compensation signal.

6. The distortion compensation device according to claim 1, further comprising:
    a phase compensation circuit arranged upstream of the distortion detection circuit and compensating phase rotation of the signal.

7. A distortion compensation device connected to a power amplifier amplifying a high-frequency signal to compensate non-linear distortion generated in the power amplifier, the distortion compensation device having an input terminal supplied with the high-frequency signal and an output terminal supplied with a power amplifier output and comprising:
    a distortion detection circuit which is coupled to the output terminal and which detects a distortion signal in the power amplifier output;
    a distortion signal generation circuit receiving the high-frequency signal through the input terminal and generating an n-th (n is an integer of two or more) non-linear distortion signal;
    a distortion compensation signal generation circuit generating a distortion compensation signal by multiplying the non-linear distortion signal by a control variable, to supply the distortion compensation signal to the power amplifier;
    a correlation circuit which is coupled to the distortion signal generation circuit and the distortion detection circuit and which determines correlation between the n-th non-linear distortion signal and the distortion signal to produce a correlation value varied so that the distortion signal is approximated to zero;
    a control variable generation circuit which is coupled to the correlation circuit and the distortion compensation signal generation circuit to supply the control variable to the distortion compensation signal generation circuit in response to the correlation value;
    a phase compensation circuit arranged upstream of the distortion detection circuit and compensating phase rotation of the power amplifier output; and
    a negative feedback circuit which is connected upstream of the distortion compensation signal generation circuit and also connected to the phase compensation circuit to negatively feed an output signal of the phase compensation circuit back to the distortion compensation signal generation circuit.

8. The distortion compensation device according to claim 7, wherein the negative feedback circuit comprises:
    a coefficient multiplication circuit which multiplies the output signal of the phase compensation circuit by a coefficient signal to obtain a product signal between the coefficient signal and the output signal of the phase compensation circuit; and
    a subtracting circuit which subtracts the product signal from the high-frequency signal supplied through the input terminal to supply a subtracted signal to the distortion compensation signal generation circuit.

* * * * *